United States Patent
Ogawa et al.

(10) Patent No.: US 9,082,720 B2
(45) Date of Patent: Jul. 14, 2015

(54) SEMICONDUCTOR DEVICE MANUFACTURING METHOD

(71) Applicant: Tokyo Electron Limited, Tokyo (JP)

(72) Inventors: Kazuto Ogawa, Tokyo (JP); Katsunori Hirai, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/467,182

(22) Filed: Aug. 25, 2014

(65) Prior Publication Data

US 2015/0056817 A1 Feb. 26, 2015

(30) Foreign Application Priority Data

Aug. 26, 2013 (JP) .................................. 2013-174868

(51) Int. Cl.
 *H01L 21/311* (2006.01)
 *H01L 21/308* (2006.01)
 *H01L 21/3065* (2006.01)

(52) U.S. Cl.
 CPC ...... *H01L 21/31116* (2013.01); *H01L 21/3065* (2013.01); *H01L 21/3081* (2013.01)

(58) Field of Classification Search
 CPC ..................... H01L 21/31116; H01L 21/3065; H01L 21/3081
 USPC .................. 438/710, 723, 724; 216/67, 79
 See application file for complete search history.

(56) References Cited

U.S. PATENT DOCUMENTS

| | | | |
|---|---|---|---|
| 2008/0062614 A1* | 3/2008 | Goia | 361/311 |
| 2008/0272467 A1* | 11/2008 | Bok et al. | 257/629 |
| 2009/0162790 A1* | 6/2009 | Romano et al. | 430/311 |
| 2010/0140221 A1* | 6/2010 | Kikuchi | 216/67 |
| 2011/0003468 A1* | 1/2011 | Song | 438/589 |
| 2013/0059450 A1* | 3/2013 | Le Gouil et al. | 438/715 |

FOREIGN PATENT DOCUMENTS

JP 2011-165769 A 8/2011

* cited by examiner

*Primary Examiner* — Shamim Ahmed
(74) *Attorney, Agent, or Firm* — Pearne & Gordon LLP (57) ABSTRACT

A direction change of space formed in an etching target layer can be suppressed while maintaining an etching selectivity for the etching target layer against a mask. A semiconductor device manufacturing method MT includes exciting a first gas by supplying the first gas containing a fluorocarbon gas, a fluorohydrocarbon gas and an oxygen gas into a processing chamber 12 (ST2); and exciting a second gas by supplying the second gas containing an oxygen gas and a rare gas into the processing chamber (ST3), and a cycle including the exciting of the first gas (ST2) and the exciting of the second gas (ST3) is repeated multiple times.

5 Claims, 6 Drawing Sheets

SEMICONDUCTOR DEVICE MANUFACTURING METHOD

CROSS-REFERENCE TO RELATED APPLICATION

This application claims the benefit of Japanese Patent Application No. 2013-174868 filed on Aug. 26, 2013, the entire disclosures of which are incorporated herein by reference.

TECHNICAL FIELD

The embodiments described herein pertain generally to a semiconductor device manufacturing method.

BACKGROUND

In a manufacturing process of semiconductor devices, a plasma etching process or the like is performed. With the miniaturization of electronic devices, it is required to form fine patterns with high precision in the plasma etching process. By way of example, it is required to form a deep hole in an etching target layer with high precision.

As one kind of semiconductor devices manufactured by the plasma etching process of forming a deep hole, there is known a NAND type flash memory device having a three-dimensional structure. In the manufacture of the three-dimensional NAND type flash memory device, there is performed a process of etching a multilayered film, in which two kinds of layers having different relative permittivities are alternately stacked on top of each other, so that a deep hole is formed in the multilayered film.

As the plasma etching of forming such a deep hole, there is known a plasma etching method as described in Patent Document 1. In the plasma etching of Patent Document 1, a cycle including a first process of setting a flow rate of at least one kind of gas, among plural kinds of gases, to be a first flow rate during a first period; and a second process of setting a flow rate of the corresponding one kind of gas to be a second flow rate different from the first flow rate during a second period is repeated under the presence of plasma.

Patent Document 1: Japanese Patent Laid-open Publication No. 2011-165769

In the plasma etching method described in Patent Document 1, since a reaction product is deposited on a surface of a mask, it is possible to etch an etching target layer with a high selectivity against the mask. This method, however, also has problems. That is, if the reaction product is deposited on the surface of the mask in a non-uniform manner, an extending direction of a hole formed in the etching target layer may be changed as the etching process proceeds. In the following description, a phenomenon that an extending direction of a space such as a hole formed in the etching target layer is changed as the etching process proceeds, that is, a phenomenon that an extending direction of the space is changed from a certain position of the etching target layer in a thickness direction thereof may be referred to as "direction change of space."

In view of the foregoing, it is required to suppress the direction change of space formed in the etching target layer while maintaining the etching selectivity for the etching target layer against the mask.

SUMMARY

In one example embodiment, a semiconductor device manufacturing method of etching a multilayered film, in which a first film and a second film having different relative permittivities from each other are alternately stacked on top of each other, with a mask in a processing chamber of a plasma processing apparatus includes exciting a first gas by supplying the first gas containing a fluorocarbon gas, a fluorohydrocarbon gas and an oxygen gas into the processing chamber; and exciting a second gas by supplying the second gas containing an oxygen gas and a rare gas into the processing chamber. Further, a cycle including the exciting of the first gas and the exciting of the second gas is repeated multiple times.

In this manufacturing method, in the exciting of the first gas, the multilayered film is etched and a generated reaction product is deposited on a surface of the mask. Further, in the exciting of the second gas, the reaction product deposited on the surface of the mask is partially removed, so that non-uniformity in the thickness of the reaction product on the surface of the mask is decreased. Further, in this manufacturing method, a cycle including the exciting of the first gas and the exciting of the second gas is repeated multiple times. Accordingly, it is possible to maintain selectivity by allowing the reaction product left in the exciting of the second gas to protect the mask with, and also possible to suppress the direction change of space formed in the multilayered film.

In one example embodiment, at least in the exciting of the first gas, a supply of a high frequency power to a lower electrode provided within the processing chamber and a stop of the supply of the high frequency power are alternately repeated, and a first negative DC voltage may be applied to an upper electrode facing the lower electrode during a period when the high frequency power is being supplied to the lower electrode, and a second negative DC voltage having an absolute value larger than an absolute value of the first negative DC voltage may be applied to the upper electrode during a period when the supply of the high frequency power is stopped. In this method, plasma is extinguished during a period when the high frequency powers are not supplied. Further, during this period, positive ions are attracted by applying the second negative DC voltage to the upper electrode, so that secondary electrons are emitted from the upper electrode. The emitted secondary electrons are irradiated to the target object. As a result, the mask is modified, so that selectivity is further increased. Furthermore, the secondary electrons neutralize the electric charge of the target object, so that the positive ions are moved more straightforwardly in the plasma generated during a period when the high frequency powers are supplied to the lower electrode. As a consequence, verticality of the space formed in the multilayered film is further enhanced.

In accordance with the example embodiments, it is possible to suppress the direction change of space formed in the etching target layer while maintaining etching selectivity for the etching target layer against the mask.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 1:
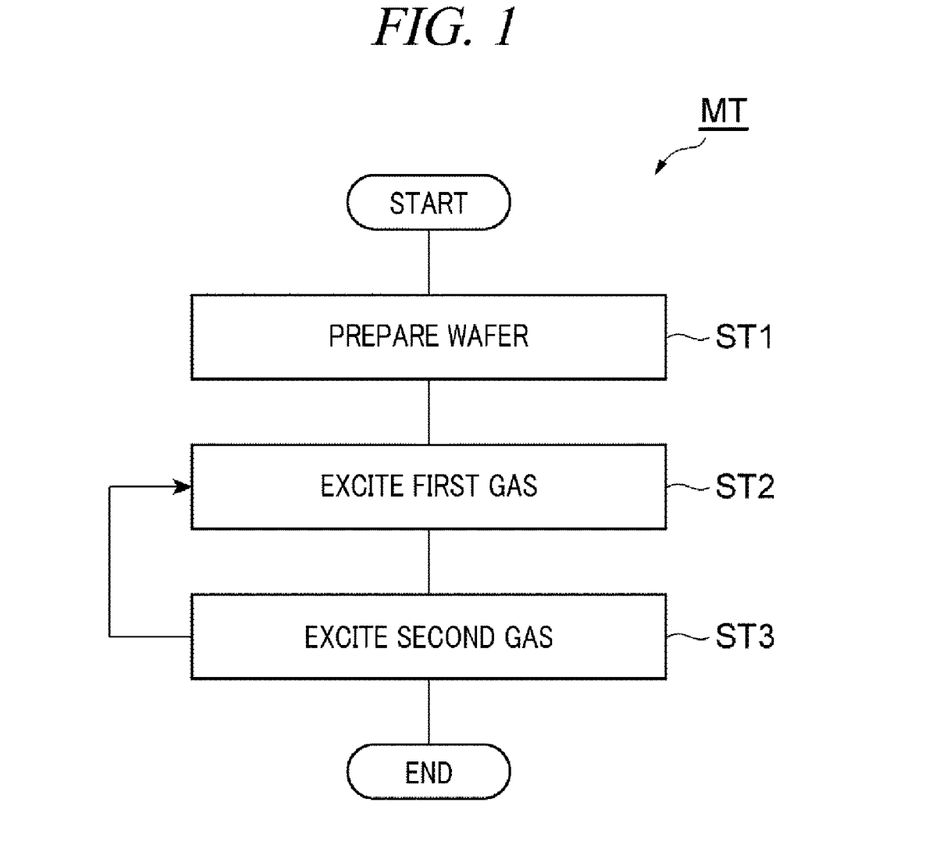
FIG. 1 is a flowchart for describing a semiconductor device manufacturing method in accordance with an example embodiment.

FIG. 1 is a flowchart for describing a semiconductor device manufacturing method in accordance with an example embodiment. The method MT depicted in FIG. 1 is performed in the manufacture of, for example, a NAND flash memory having a three-dimensional structure. The method MT includes three blocks ST1, ST2 and ST3. At block ST1 (prepare wafer), a processing target object (hereinafter, referred to as "wafer") W is prepared. At block ST2 (excite first gas), a first gas is excited within a processing chamber of a plasma processing apparatus to etch a multilayered film on the wafer W. At block ST3 (excite second gas), a second gas is excited within the processing chamber of the plasma processing apparatus to partially remove a reaction product generated by the etching.

In the method MT, after block ST3 of exciting the second gas, the process returns back to block ST2 of exciting the first gas. That is, a cycle including block ST2 of exciting the first gas and block ST3 of exciting the second gas are repeated plural times.

Figure 2:
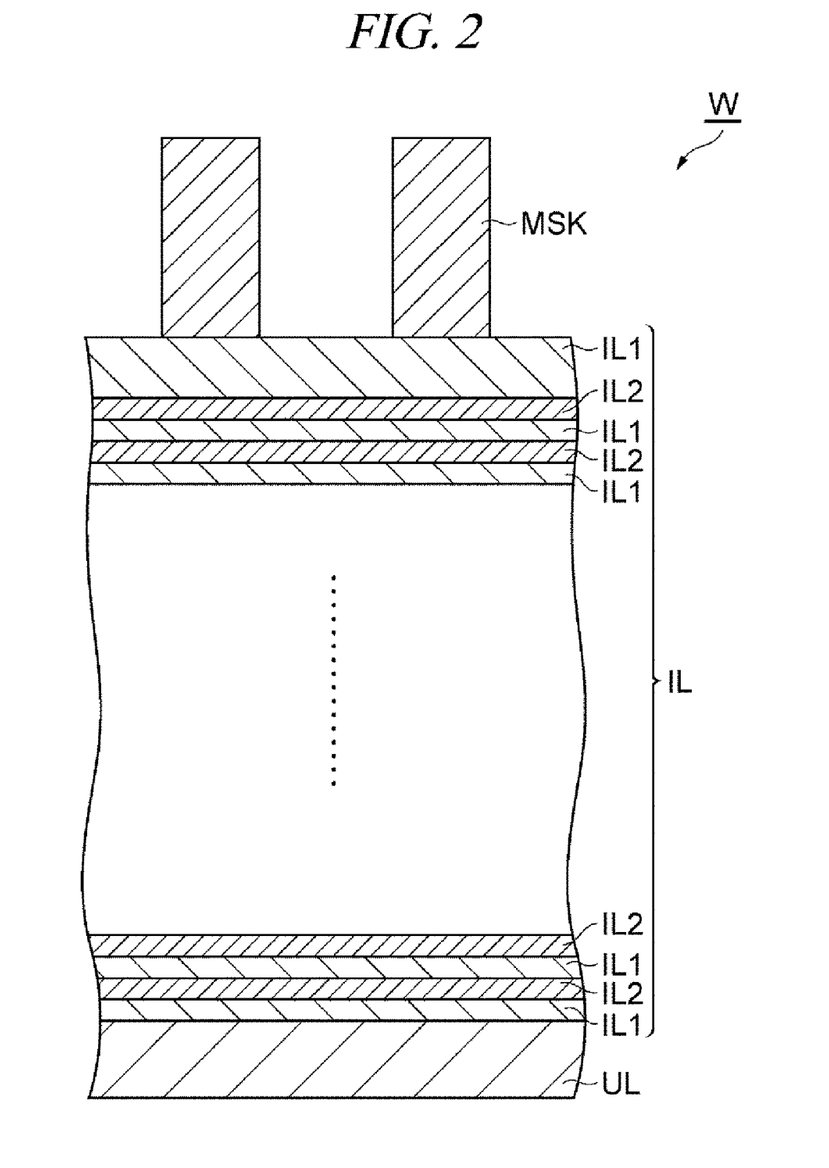
FIG. 2 is a diagram illustrating an example of a wafer prepared at block ST1.

FIG. 2 is a diagram illustrating an example of a wafer prepared at block ST1. A wafer W shown in FIG. 2 has an underlying layer UL, a multilayered film IL and a mask MSK. The underlying layer UL may be a polycrystalline silicon layer formed on the substrate. The multilayered film IL is formed on the underlying layer UL. The multilayer film IL has a structure where two kinds of dielectric films IL1 and IL2 having different relative permittivities are alternately stacked on top of each other. In the example embodiment, the dielectric film IL1 is a silicon oxide film, and the dielectric film IL2 is a silicon nitride film. A thickness of the dielectric film IL1 is set to be in the range from, e.g., about 5 nm to about 50 nm, and a thickness of the dielectric film IL2 is set to be in the range from, e.g., about 10 nm to about 75 nm. As for the stacking number of the dielectric films IL1 and IL2, twelve layers of silicon oxide films and twelve layers of silicon nitride films may be stacked alternately, for example. A total number of twenty-four or more layers of these films may be stacked alternately. The mask MSK is formed on the multi-layered film IL. The mask MSK has a pattern for forming a deep space such as a hole or a trench in the multilayered film IL. The mask MSK may be made of, but not limited to, amorphous carbon. Alternatively, the mask MSK may be made of an organic polymer.

Figure 3:
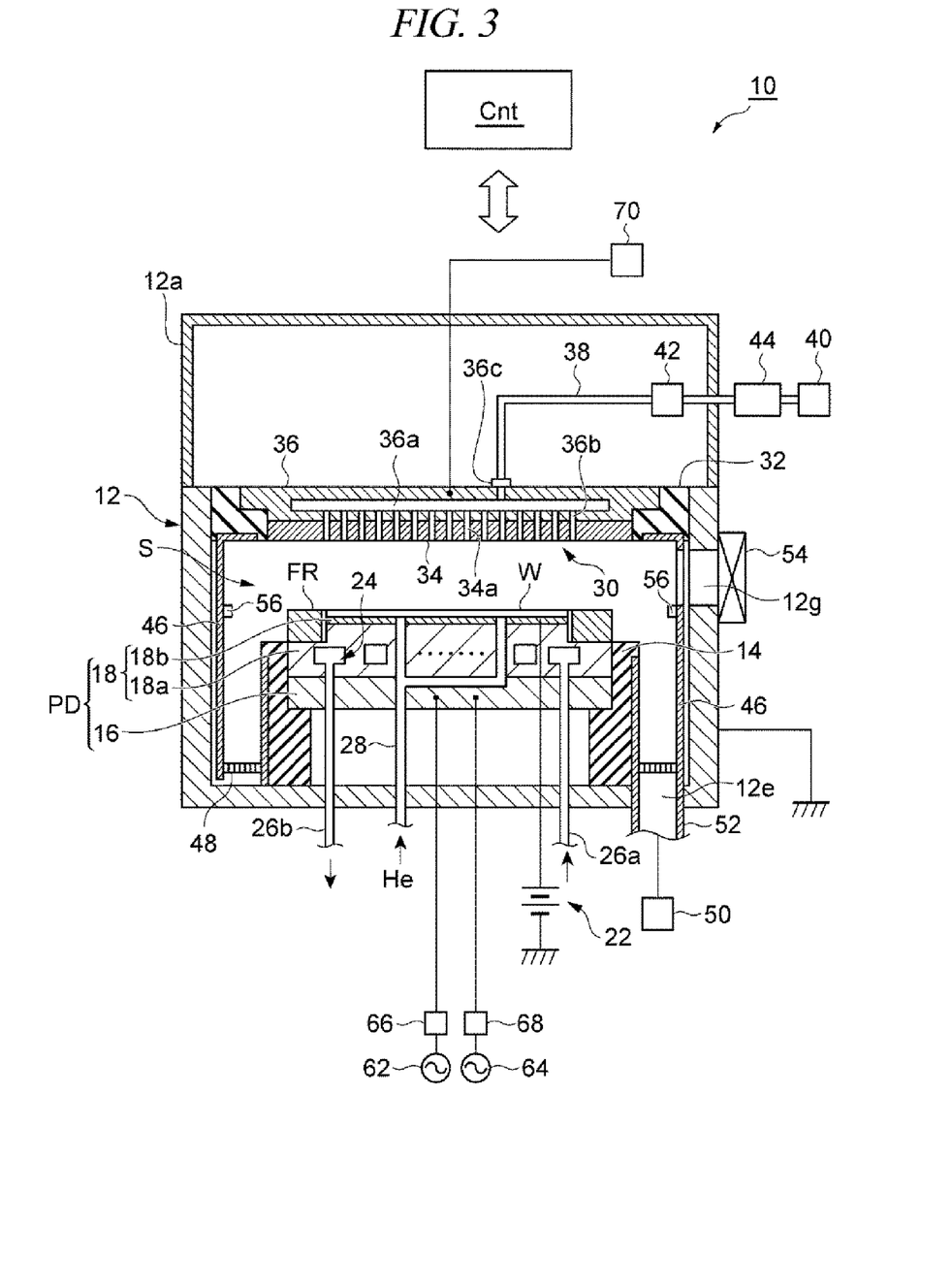
FIG. 3 is a diagram schematically illustrating an example of a plasma processing apparatus.

Referring back to FIG. 1, at block ST1 of the method MT, the wafer W is prepared within a processing chamber of a parallel plate type plasma processing apparatus. Below, an example of the plasma processing apparatus capable of performing the method MT will be described. FIG. 3 is a diagram schematically illustrating the example plasma processing apparatus and depicts a structure of the plasma processing apparatus, seen from a cross sectional view.

A plasma processing apparatus 10 shown in FIG. 3 is configured as a capacitively coupled parallel-plate type plasma etching apparatus. The plasma processing apparatus 10 includes a substantially cylindrical processing chamber 12. An inner wall surface of the processing chamber 12 is made of anodically oxidized aluminum. The processing chamber 12 is frame-grounded.

A substantially cylindrical supporting member 14 made of an insulating material is provided on a bottom of the processing chamber 12. Within the processing chamber 12, the supporting member 14 is vertically extended from the bottom of the processing chamber 12. The supporting member 14 is configured to support thereon a mounting table PD provided within the processing chamber 12. To elaborate, as shown in FIG. 3, the supporting member 14 supports the mounting table PD on an inner wall surface thereof.

The mounting table PD is configured to mount a wafer W on a top surface thereof. The mounting table PD includes a lower electrode (electrode member) 16 and a supporting unit 18. The lower electrode 16 is made of a metal such as, but not limited to, aluminum and has a substantially circular plate shape. The supporting unit 18 is provided on a top surface of the lower electrode 16.

The supporting unit 18 is configured to support the wafer W thereon. The supporting unit 18 includes a base 18a and an electrostatic chuck 18b. The base 18a is made of a metal such as, but not limited to, aluminum and has a substantially circulate plate shape. The base 18a is provided on the lower electrode 16 and is electrically connected with the lower electrode 16. The electrostatic chuck 18b is provided on the base 18a. The electrostatic chuck 18b has a structure in which an electrode made of a conductive film is interposed between a pair of insulating layers or insulating sheets. The electrode of the electrostatic chuck 18b is electrically connected to a DC power supply 22. The electrostatic chuck 18b is configured to attract and hold the wafer W by an electrostatic force such as a Coulomb force generated by a DC voltage applied from the DC power supply 22.

A focus ring FR is provided on a periphery portion of the base 18a to surround a periphery portion of the wafer W and the electrostatic chuck 18b. The focus ring FR is provided to improve etching uniformity. The focus ring FR is made of a material which is appropriately selected depending on a material of an etching target film. By way of non-limiting example, the focus ring FR may be made of quartz.

A coolant path 24 is formed within the base 18a. The coolant path 24 serves as a temperature control device in accordance with the example embodiment. A coolant of a preset temperature is supplied into and circulated through the coolant path 24 from an external chiller unit via pipelines 26a and 26b. By controlling the temperature of the coolant circulated through the coolant path 24, it is possible to control a temperature of the wafer W held on the supporting unit 18.

Further, the plasma processing apparatus 10 includes a gas supply line 28. The gas supply line 28 is configured to supply a heat transfer gas such as a He gas from a heat transfer gas supply unit into a gap between a top surface of the electrostatic chuck 18b and a rear surface of the wafer W.

Further, the plasma processing apparatus 10 includes an upper electrode 30. The upper electrode 30 is provided above the mounting table PD, facing the mounting table PD. The lower electrode 16 and the upper electrode 30 are arranged substantially in parallel to each other. A processing space S in which a plasma process is performed on the wafer W, is formed between the upper electrode 30 and the lower electrode 16.

The upper electrode 30 is placed at a top portion of the processing chamber 12 through an insulating shield member 32. The upper electrode 30 may include an electrode plate 34 and an electrode supporting body 36. The electrode plate 34 faces the processing space S and has a multiple number of gas discharge holes 34a. The electrode plate 34 may be made of or semiconductor or a low-resistance conductor having low Joule's heat.

The electrode supporting body 36 is configured to support the electrode plate 34 in a detachable manner and may be made of a conductive material such as, but not limited to, aluminum. The electrode supporting body 36 may have a water cooling structure. A gas diffusion space 36a is formed within the electrode supporting body 36. A multiple number of gas holes 36b communicating with the gas discharge holes 34a are extended downward from the gas diffusion space 36a. Further, the electrode supporting body 36 has a gas inlet opening 36c through which a processing gas is introduced into the gas diffusion space 36a, and a gas supply line 38 is connected to the gas inlet opening 36c.

Figure 4:
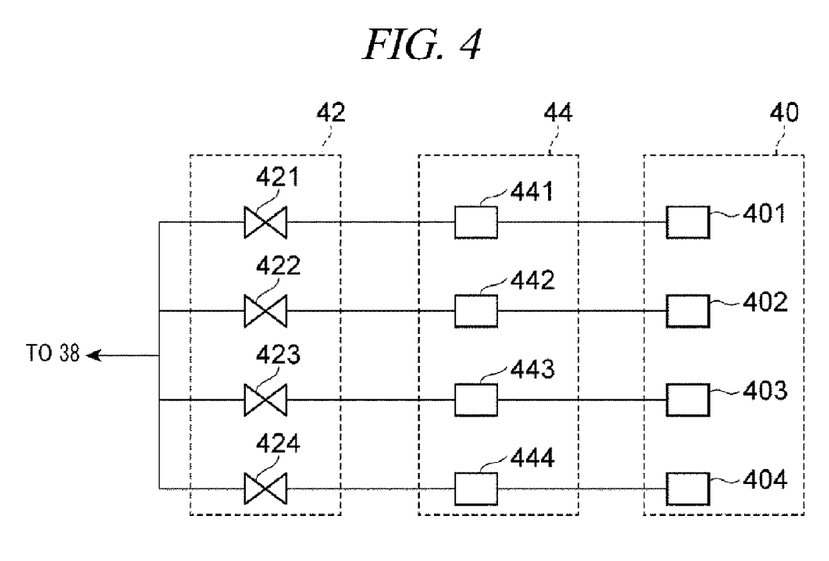
FIG. 4 provides a detailed view of a valve group, a flow rate controller group and a gas source group shown in FIG. 3.

The gas supply line 38 is connected to a gas source group 40 via a valve group 42 and a flow rate controller group 44. FIG. 4 provides a detailed view depicting the valve group, the flow rate controller group and the gas source group shown in FIG. 3. As depicted in FIG. 4, the gas source group 40 includes a multiple number of (N number of) gas sources 401 to 404. The gas sources 401 to 404 are a $C_4F_6$ gas source, a $CH_2F_2$ gas source, an $O_2$ gas source and an Ar gas source, respectively. Further, the gas source 401 may be any fluorocarbon gas source, and the gas source 402 may be any fluorohydrocarbon gas source. By way of non-limiting examples, a $C_4F_8$ gas or a $CF_4$ gas may be used as the fluorocarbon gas besides the $C_4F_6$ gas, and a $CH_3F$ gas or a $CHF_3$ gas may be used as the fluorohydrocarbon gas besides the $CH_2F_2$ gas. Further, the gas source 403 may be any oxygen gas source, and the gas source 404 may be any rare gas source.

The flow rate controller group 44 includes a multiple number of (N number of) flow rate controllers 441 to 444. The flow rate controllers 441 to 444 control flow rates of the gases supplied from the corresponding gas sources. The flow rate controllers 441 to 444 may be implemented by mass flow controllers (MFC) or FCS. The valve group 42 includes multiple number of (N number of) valves 421 to 424. The gas sources 401 to 404 are connected to the gas supply line 38 via the flow rate controllers 441 to 444 and the valves 421 to 424, respectively. The gases from the gas sources 401 to 404 are introduced into the gas diffusion space 36a through the gas supply line 38, and are discharged into the processing space S through the gas holes 36b and the gas discharge holes 34a.

Referring back to FIG. 3, the plasma processing apparatus 10 may further include a grounding conductor 12a. The grounding conductor 12a may have a substantially cylindrical shape and is extended upward from a sidewall of the processing chamber 12 to a position higher than the upper electrode 30.

Further, a deposition shield 46 is detachably attached to an inner wall of the processing chamber 12. The deposition shield 46 may also be provided at an outer periphery of the supporting member 14. The deposition shield 46 is configured to suppress an etching by-product (deposit) from adhering to the processing chamber 12. The deposition shield 46 may be made of, but not limited to, an aluminum member coated with ceramics such as $Y_2O_3$.

A gas exhaust plate 48 is provided between the supporting member 14 and the inner wall of the processing chamber 12 at a bottom portion thereof. The gas exhaust plate 48 may be made of, but not limited to, an aluminum member coated with ceramics such as $Y_2O_3$. A gas exhaust opening 12e is formed at the processing chamber 12 to be located under the gas exhaust plate 48, and a gas exhaust device 50 is connected to the gas exhaust opening 12e via a gas exhaust line 52. The gas exhaust device 50 includes a vacuum pump such as a turbo molecular pump and is configured to depressurize the inside of the processing chamber 12 to a desired vacuum degree. Further, a loading/unloading opening 12g for the wafer W is formed at the sidewall of the processing chamber 12, and the loading/unloading opening 12g is opened or closed by a gate valve 54.

A conductive member (GND block) 56 is provided at the inner wall of the processing chamber 12. The conductive member 56 is fastened to the inner wall of the processing chamber 12 to be located at a height position substantially same as the wafer W. The conductive member 56 is connected to the ground in a DC manner and has an effect of suppressing an abnormal discharge. Here, the height position of the conductive member 56 is not limited to the example shown in FIG. 3 as long as the conductive member 56 is located within a plasma generation region.

Further, the plasma processing apparatus 10 further includes a first high frequency power supply 62 and a second high frequency power supply 64. The first high frequency power supply 62 is a power source configured to generate a first high frequency (RF: Radio Frequency) power for plasma generation having a frequency ranging from, e.g., about 27 MHz to about 100 MHz (e.g., about 40 MHz). The first high frequency power supply 62 is connected to the lower electrode 16 via a matching unit 66. The matching unit 66 is a circuit for matching an output impedance of the first high frequency power supply 62 and an input impedance on the load side thereof (on the side of the lower electrode 16).

The second high frequency power supply 64 is a power source configured to generate a second high frequency power for attracting ions into the wafer W, i.e., a high frequency bias power. Specifically, the second high frequency power supply 64 generates a high frequency power of a frequency ranging from, e.g., about 400 kHz to about 13.56 MHz (e.g., about 3 MHz). The second high frequency power supply 64 is connected to the lower electrode 16 via a matching unit 68. The matching unit 68 is a circuit for matching an output impedance of the second high frequency power supply 64 and an input impedance on the load side thereof (on the side of the lower electrode 16).

The plasma processing apparatus 10 may further include a DC power supply unit 70. The DC power supply unit 70 is connected to the upper electrode 30. The DC power supply unit 70 is configured to generate a negative DC voltage and apply the negative DC voltage to the upper electrode 30.

In the example embodiment, a controller Cnt is configured to send control signals to the first and second high frequency power supplies 62 and 64 such that the high frequency powers from the first and second high frequency power supplies 62 and 64 are applied to the lower electrode 16 while ON and OFF of the high frequency powers are switched in pulse shape. Further, the controller Cnt is also configured to send a control signal to the DC power supply unit 70 such that a second negative DC voltage, which has an absolute value larger than that of a first negative DC voltage applied during a period when the high frequency powers are ON (when the high frequency powers are being supplied), is applied to the upper electrode 30 during a period when the high frequency powers are OFF (when the supply of the high frequency powers is stopped). Further, an ON-and-OFF frequency of the high frequency powers of the first and second high frequency power supplies 62 and 64 is set to be, e.g., about 1 Hz to about 40 Hz. Here, the term "ON-and-OFF frequency of the high frequency powers" means a frequency having, as a single cycle, an ON period and an OFF period of the high frequency powers of the first and second high frequency power supplies 62 and 64. Further, a duty ratio indicating the percentage of the ON period of the high frequency powers in the single cycle is set to be, e.g., about 50% to about 90%. Meanwhile, the switchover of the DC voltage value of the DC power supply unit may be implemented synchronously with the ON/OFF switchover of the high frequency powers of the first and second high frequency power supplies 62 and 64.

Referring back to FIG. 1, the description of the method MT will be continued. At block ST1, the wafer W transferred into the processing chamber 12 is mounted on the mounting table PD, and attracted to and held on the electrostatic chuck 18b. Then, the process of block ST2 is performed in the method MT.

At block ST2, the first gas is excited within the processing chamber 12. To this end, a processing gas is supplied into the processing chamber 12 from the gas source group 40, and an internal pressure of the processing chamber 12 is set to a preset pressure value. This processing gas is a first gas containing a fluorocarbon gas, a fluorohydrocarbon gas and an oxygen gas. By way of example, the first gas may contain a $C_4F_6$ gas, a $CH_2F_2$ gas and an $O_2$ gas. Further, at block ST2, the high frequency powers from the first and second high frequency power supplies 62 and 64 are applied to the lower electrode 16. Various processing conditions at block ST2 may be set within the ranges specified below, for example.

Flow rate of $C_4F_6$ gas: 15 sccm to 150 sccm
Flow rate of $CH_2F_2$ gas: 15 sccm to 150 sccm
Flow rate of $O_2$ gas: 20 sccm to 200 sccm
Frequency of high frequency power of first high frequency power supply 62: 27 MHz to 100 MHz
High frequency power of first high frequency power supply 62: 500 W to 2700 W
Frequency of high frequency power of second high frequency power supply 64: 400 kHz to 13 MHz
High frequency power of second high frequency power supply 64: 5000 W to 7800 W
Internal pressure of processing chamber 12: 2.00 Pa to 5.32 Pa (15 mT to 40 mT)

Further, in the example embodiment, the ON and OFF of the high frequency powers of the first and second high frequency power supplies 62 and 64 may be synchronously switched in a pulse shape. Further, the absolute value of the negative DC voltage applied to the upper electrode 30 as described above may be altered synchronously with the ON/OFF switchover of the high frequency powers of the first and second high frequency power supplies 64. In this example embodiment, plasma is generated when the high frequency powers are ON, and plasma existing directly above the wafer W is extinguished when the high frequency powers are OFF. Further, positive ions are attracted into and collided with the upper electrode 30 by applying the negative DC voltage to the upper electrode 30 when the high frequency powers are OFF, so that secondary electrons are emitted from the upper electrode 30. The emitted secondary electrons are configured to modify the mask MSK. As a result, the etching resistance of the mask MSK may be improved, and the selectivity may also be increased. Further, the secondary electrons may neutralize the electric charge of the wafer W, so that ions are moved more straightforwardly into the space such as a hole or a trench formed in the multilayered film IL in a subsequent etching process. As a consequence, verticality of the space formed in the multilayered film IL may be further enhanced. Further, conditions regarding the ON/OFF switchover of the high frequency powers of the first and second high frequency power supplies 62 and 64 and conditions for the negative DC voltage applied to the upper electrode 30 are set as follows, for example.

Figure 5:
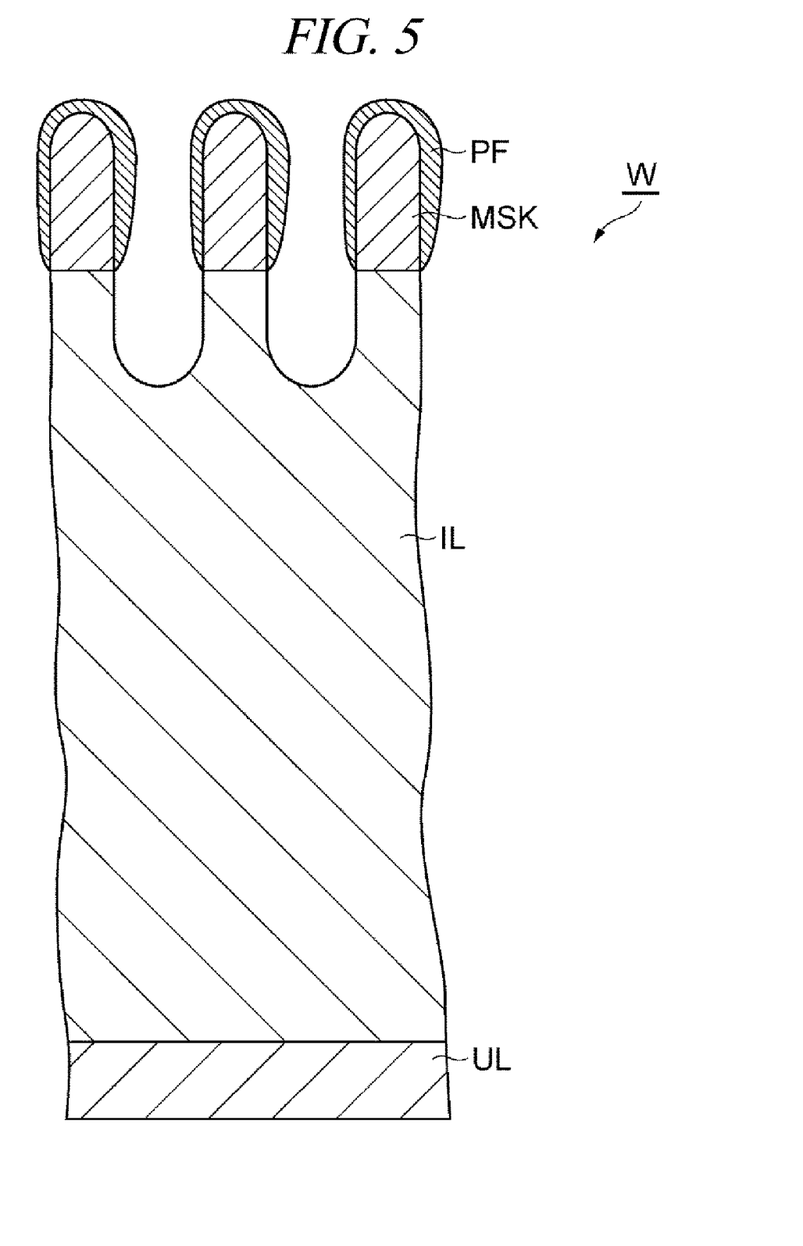
FIG. 5 is a diagram illustrating a state of the wafer being etched at block ST2.

ON-and-OFF frequency of high frequency powers: 1 Hz to 40 Hz
Duty ratio of ON period of high frequency powers in a single cycle: 50% to 90%
Absolute value of negative DC voltage during ON period of high frequency powers: −150 V to −500 V
Absolute value of negative DC voltage during OFF period of high frequency powers: −350 V to −1000 V At block ST2, plasma is generated by exciting the first gas in the processing chamber 12. Accordingly, the multilayered film IL is etched. FIG. 5 is a diagram depicting a state of the wafer W being etched. As shown in FIG. 5, the multilayered film IL is etched under openings of the mask MSK. Further, at block ST2, a protective film PF containing carbon included in the processing gas adheres to the surface of the mask MSK. At this time, the protective film PF is deposited on the surface of the mask MSK in non-uniform thickness. Then, in the method MT, the process of block ST3 is performed.

At block ST3, the second gas is excited within the processing chamber 12. To this end, a processing gas is supplied into the processing chamber 12 from the gas source group 40, and the internal pressure of the processing chamber 12 is set to a preset pressure value. This processing gas is a second gas containing an oxygen gas and a rare gas. By way of non-limiting example, the second gas may contain an $O_2$ gas and an Ar gas. Further, at block ST3, the high frequency powers from the high frequency power supplies 62 and 64 are applied to the lower electrode 16. Various conditions at block ST3 are set to be in the ranges specified below, for example.

Flow rate of $O_2$ gas: 10 sccm to 1000 sccm
Flow rate of Ar gas: 0 sccm to 1000 sccm
Frequency of high frequency power of first high frequency power supply 62: 27 MHz to 100 MHz
High frequency power of first high frequency power supply 62: 200 W to 2700 W
Frequency of high frequency power of second high frequency power supply 64: 400 kHz to 13 MHz
High frequency power of second high frequency power supply 64: 0 W to 3000 W
Internal pressure of processing chamber 12: 1.33 Pa to 13.3 Pa (10 mT to 100 mT)

Figure 6:
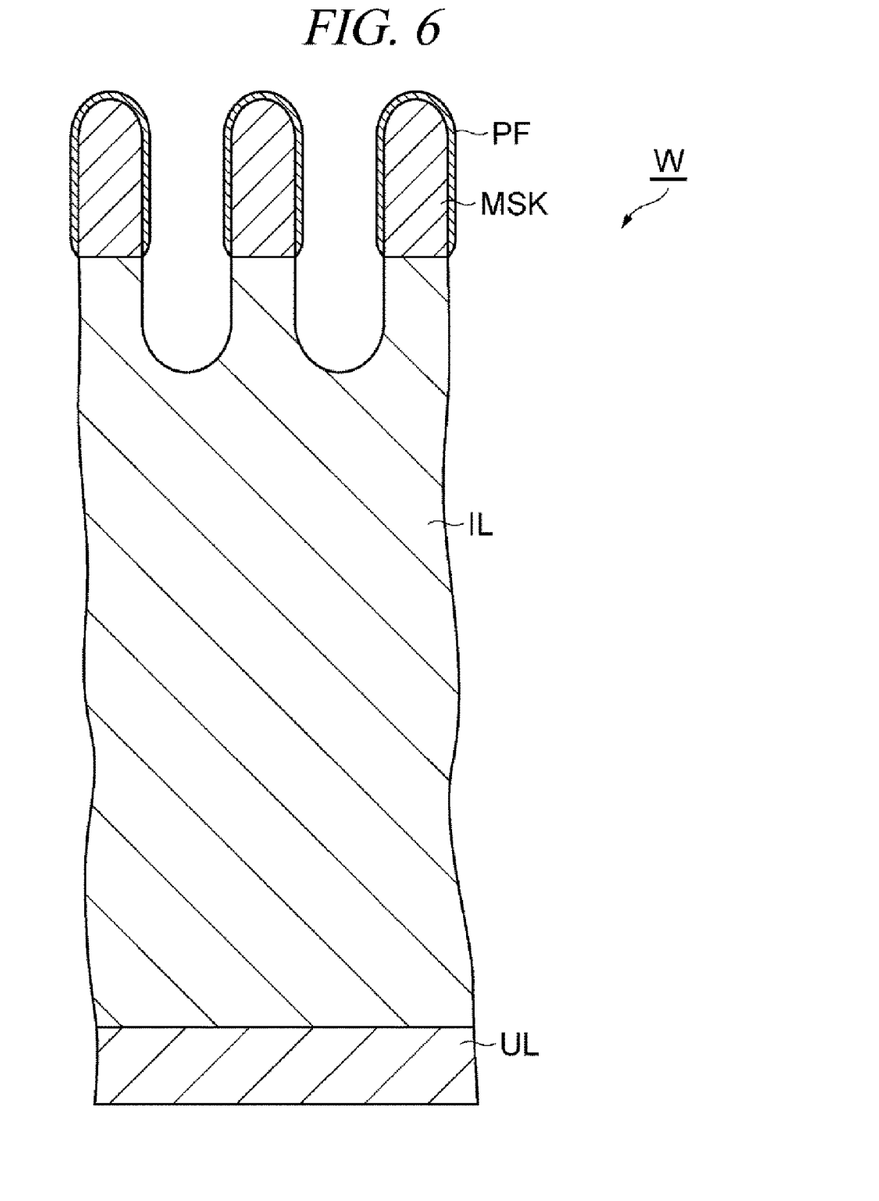
FIG. 6 is a diagram illustrating the wafer in a state where non-uniformity in thickness of a protective film is reduced at block ST3.

At block ST3, plasma is generated by exciting the second gas in the processing chamber 12. Accordingly, the protective film PF deposited on the surface of the mask MSK in the non-uniform thickness is partially removed. FIG. 6 is a diagram depicting a state of the wafer W in which non-uniformity in the thickness of the protective film is decreased at block ST3. As depicted in FIG. 6, as the protective film PF deposited on the surface of the mask MSK is partially removed, non-uniformity in the thickness of the remaining protective film PF is reduced. Then, in the method MT, the process returns back to block ST2, and the etching of the wafer W is performed again.

At repeated block ST2, it is possible to maintain the selectivity by protecting the mask MSK with the protective film PF of which thickness non-uniformity is reduced. In addition, since the thickness non-uniformity of the protective film PF is decreased, it is possible to suppress an extending direction of the space such as a hole or a trench formed in the multilayered film IL from being changed from a certain position of the multilayered film IL in the thickness direction thereof due to the presence of the thickness non-uniformity of the protective film PF. At block ST2, the protective film PF containing carbon included in the processing gas may adhere to the surface of the mask MSK again, so that the protective film PF is deposited in non-uniform thickness. Then, in the method MT, the process of block ST3 is performed again, and the protective film PF is partially removed.

As stated above, the cycle including the process of block ST2 of etching the wafer W and the process of block ST3 of partially removing the protective film PF deposited on the surface of the mask MSK is repeated plural times. Accordingly, it is possible to suppress the direction change of the space formed in the multilayered film IL while maintaining selectivity by protecting the mask MSK with the protective film PF of which thickness non-uniformity is reduced.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A semiconductor device manufacturing method of etching a multilayered film, in which a first film and a second film having different relative permittivities from each other are alternately stacked on top of each other, with a mask in a processing chamber of a plasma processing apparatus, the semiconductor device manufacturing method comprising:
    exciting a first gas by supplying the first gas containing a fluorocarbon gas, a fluorohydrocarbon gas and an oxygen gas into the processing chamber; and
    exciting a second gas by supplying the second gas containing an oxygen gas and a rare gas into the processing chamber,
    wherein a cycle including the exciting of the first gas and the exciting of the second gas is repeated multiple times.

2. The semiconductor device manufacturing method of claim 1,
    wherein at least in the exciting of the first gas, a supply of a high frequency power to a lower electrode provided within the processing chamber and a stop of the supply of the high frequency power are alternately repeated, and
    a first negative DC voltage is applied to an upper electrode facing the lower electrode during a period when the high frequency power is being supplied to the lower electrode, and a second negative DC voltage having an absolute value larger than an absolute value of the first negative DC voltage is applied to the upper electrode during a period when the supply of the high frequency power is stopped.

3. The semiconductor device manufacturing method of claim 1,
    wherein the first film and the second film are stacked in twenty-four or more layers in total.

4. The semiconductor device manufacturing method of claim 1,
    wherein the first film is a silicon oxide film, and the second film is a silicon nitride film.

5. The semiconductor device manufacturing method of claim 1,
    wherein the mask is made of amorphous carbon.

* * * * *